Sept. 23, 1969 E. L. ARNY 3,469,018

CIRCUIT BOARD

Filed Dec. 16, 1966

INVENTOR
EDGAR L. ARNY
BY Forrest J. Lilly
ATTORNEY

United States Patent Office 3,469,018

Patented Sept. 23, 1969

3,469,018

CIRCUIT BOARD

Edgar L. Arny, Manhattan Beach, Calif., assignor to Chemical and Aerospace Products, Inc., Wilmington, Calif., a corporation of California Filed Dec. 16, 1966, Ser. No. 602,380
Int. Cl. H05k *1/02*
U.S. Cl. 174—68.5 7 Claims

ABSTRACT OF THE DISCLOSURE

An electronic circuit board having multi-rail electrically conductive ribbons in grooves preformed in a machine or chemically etched electrically insulating layer in accordance with a predetermined circuit trace pattern. The board is provided with holes at selected locations to enable electrically conductive leads of components to pass through the board in abutment with one or more rails of the conductive ribbon, so that the leads can be welded or soldered to the rails.

This invention relates generally to improvements in circuit boards of the "printed" or preformed laminate type and, more particularly, to improvements in preformed circuit board construction resulting in enhanced reliability, durability and economy.

Modern electronic fabrication and packaging techniques make extensive use of circuit boards of the type known as "printed" circuits, wherein an electrically conductive circuit trace pattern is mounted upon an electrically insulating base member. The trace pattern may be directly printed upon the insulating base member by conventional printing methods, by stenciling, by etching a metal face, or the circuitry may be separately preformed and subsequently secured to the insulating base member by an appropriate adhesive. Such printed circuits offer the advantages of being compact, lightweight, easily duplicated, and more economical than corresponding manually wired circuits.

In making electrical connections to the traces of such circuit boards, it has been a common practice to drill holes through the insulating base member and circuit trace pattern of the circuit board, and plate a coating of metal on the inside surface of the holes so formed. Alternatively, an eyelet, rivet or the like is sometimes used to provide an electrically conductive path through the insulating base member to the circuit trace pattern. An electrical conductor is then passed through each eyelet or plated-through hole and is soldered or welded to the circuit trace pattern.

These methods of providing connections to circuit boards are not only complicated and relatively expensive, but have not always proven entirely satisfactory under all conditions of service. In many instances, such connection arrangements are incapable of withstanding the typical welding heats encountered when connecting the conductive leads passing through the circuit board to the circuit trace pattern of the board. This inability to withstand welding heats is responsible in large part for the continued use of manual point-to-point wiring systems instead of printed circuit boards in some applications.

Additional problems encountered with the printed circuit boards of the prior art have been the difficulty in repairing defective circuitry, either components or conductors, and the difficulty of building-in reliable redundant circuitry.

Hence, those concerned with the development of preformed circuit technology have long recognized the need for improved circuit boards embodying the advantages of both printed circuits and point-to-point wired circuits and capable of overcoming the above and other disadvantages of the prior art. The present invention fulfills this need.

Accordingly, it is an object of the present invention to provide a new and improved electronic circuit board of the preformed type wherein the electrical circuitry is capable of withstanding typical welding heats.

Another object is to provide a new and improved circuit board of the preferred type which is as rugged and reliable as manual point-to-point wiring.

A further object of the invention is the provision of a new and improved preformed circuit board which is easily repairable.

Still another object is to provide a new and improved circuit board capable of providing redundant circuitry in a relatively simple and economical manner.

Yet another object of the present invention is the provision of a new and improved preformed circuit board which is relatively economical to fabricate.

A still further object is to provide a new and improved electronic circuit board having substantially all of the advantages of a point-to-point wired module yet requiring considerably less assembly time.

The above and other objects and advantages of this invention will become apparent from the following description, when taken in conjunction with the accompanying drawing of an illustrative embodiment thereof, and wherein.

Basically, the present invention provides a new and improved electronic circuit board which is made by securing a multi-rail electrically conductive ribbon in grooves which have been preformed in a machined or chemically etched electrically insulating layer in accordance with a predetermined circuit trace pattern, the board being also provided with holes at selected locations to enable the electronically conductive leads of components to pass through the board in abutment with one or more rails of the conductive ribbon so that the leads can be welded or soldered to the rails.

Figure 1:
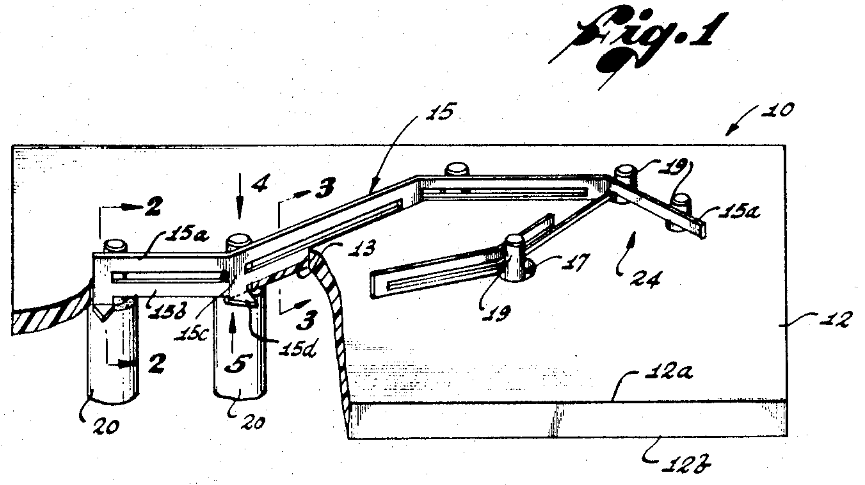
FIGURE 1 is a perspective view, a portion being shown in section, of a presently preferred embodiment of an electronic circuit board constructed in accordance with the present invention.

Referring now to the drawings, and particularly to FIGURE 1, thereof, there is shown an electronic circuit board 10 fabricated in accordance with the present invention. The circuit board 10 includes an electrically insulating base 12 in which a plurality of grooves 13 are provided for receipt of an electrically conductive ribbon 15, the ribbon defining a conductive circuit trace pattern when installed in the grooves of the circuit board.

The base 12 is also provided with a plurality of clearance holes 17 in prescribed locations along the circuit board 10. These holes 17 intersect the grooves 13 in the base 12 and enable the electrically conductive leads 19 from a plurality of electrical components 20 below the circuit board 10 to pass through the board in abutment with the conductive ribbon 15 so that electrical contact is established between the ribbon and the leads. The leads 19 are secured to the ribbon 15 by any well known process such as soldering or welding.

The electrically insulating base 12 is a substantially planar plastic layer, typically .015–.020 inch in thickness, and preferably of a glass reinforced plastic material, such as glass reinforced epoxy, glass reinforced polyester formulations and the like. It will, therefore, be understood that wherever epoxy or epoxy-glass materials are referred to in the ensuing description, the latter is to be considered solely by way of example rather than limitation, and any equivalent material may be substituted therefor without in any way departing from the spirit and scope of the invention.

The grooves 13 are provided in the upper face 12*a* of the base 12 in the desired circuit trace pattern and are typically .015 inch wide and .010 inch in depth. The grooves 13 may be provided in the base 12 by well known machining techniques or by chemical etching. A method for selectively etching epoxy-glass laminates such as the base 12 is set forth in U.S. Patent No. 3,266,693, issued August 16, 1966, for "Method and Means for Etching Glass and Glass Reinforced Plastics."

Figures 2, 3:
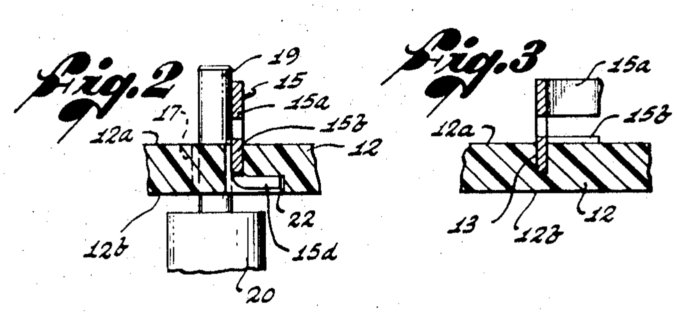
FIGURE 2 is an enlarged fragmentary sectional view of the circuit board taken along the line 2—2 in FIGURE 1.
FIGURE 3 is an enlarged fragmentary sectional view of the circuit board taken along the line 3—3 in FIGURE 1.
Figure 4:
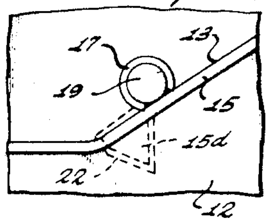
FIGURE 4 is an enlarged, partial top plan view of a portion of the circuit board and is taken in the direction of the arrow 4 in FIGURE 1.
Figure 6:
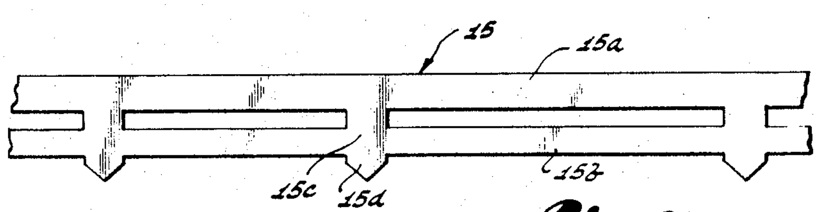
FIGURE 6 is a partial elevational view of a presently preferred embodiment of an electrically conductive ribbon used in fabricating the circuit board of the present invention.
Figure 5:
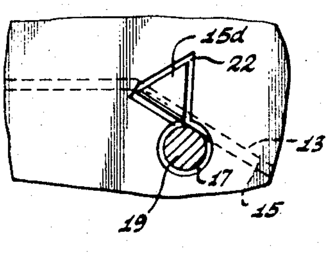
FIGURE 5 is an enlarged, partial bottom plan view of a portion of the circuit board and is taken in the direction of the arrow 5 in FIGURE 1.

As best observed in FIGURES 1–3 and 6, the electrically conductive ribbon 15 includes a pair of parallel, spaced apart, co-extensive upper and lower rails 15*a*, 15*b*, respectively, which are held together by integral posts 15*c* which bridge between the rails at spaced intervals along the rails. The integral posts 15*c* extend perpendicular to the rails 15*a*, 15*b* and bridge betwen the rails so that the rails are connected together electrically to provide a pair of electrical conductors in parallel. The lower end of each post 15*c* terminates in an arrow-shaped locking tab 15*d* to facilitate insertion of the ribbon 15 into the grooves 13 of the circuit board base 12 and subsequent locking of the ribbon in place as shown in FIGURES 2, 4, and 5. The ribbon 15 is installed so that its width is substantially perpendicular to the face 12*a* in which the grooves 13 are located.

The electrically conductive ribbon 15 is typically of nickel, Kovar or any other weldable alloy and is usually approximately .007 inch thick, so that a relatively heavy conductor capable of withstanding typical welding heats is provided by the ribbon. The multi-rail and post configuration of the ribbon 15, best observed in FIGURE 6, may be provided by stamping or etching metal ribbon by techniques well known in the art. The ribbon 15 can be provided in rolls (not shown) from which the necessary length of ribbon adapted to fit into the grooves 13 may be cut.

As shown in FIGURES 2, 4 and 5, the bottom face 12*b* of the base 12 is provided with a plurality of recesses or undercut portions 22 below the grooves 13 at locations corresponding to the locations of the posts 15*c* and locking tabs 15*d* of the ribbon 15 when the ribbon is installed within the grooves. After the ribbon 15 is thus installed, the locking tabs 15*d* are bent at rigt angles to the plane of the ribbon by an appropriate tool (not shown) from the under side of the circuit board. This effectively locks the ribbon 15 in position on the circuit board 10.

By virtue of the double rail arrangement provided by the conductive ribbon 15, the component leads 19 extending through the holes 17 in the base 12 can be welded to both rails 15*a*, 15*b* if desired rather than to only a single rail. Welding a lead 19 to both rails of the ribbon 15 essentially connects the lead to two conductors which are in parallel and thus provides redundant circuitry with its attendant reliability. Where such a redundant circuit arrangement is not desired, the rails may be split and individual rails directed to different portions of the circuit, as shown in area 24 in FIGURE 1. Splitting the rails in this fashion enables cross-over connections in the same circuit deck.

In actual operation, the manufacturing procedure for the circuit board 10 is as follows:

First, the ribbon receiving grooves 13, clearance holes 17 and tab recesses 22 are machined or etched at appropriate locations in the insulating base 12.

Second, the electrically conductive ribbon 15 is cut to proper length for installation in the grooves 13, the length being measured from an appropriate reference point on the ribbon, such as one of the posts 15*c*, so that the post positions will be aligned with the tab recesses 22 when the ribbon is installed. The ribbon 15 is then bent to the shape of the grooves 13 and inserted into the grooves.

After thus positioning the ribbon 15, the locking tabs 15*d* are bent at right angles to the ribbon from beneath the circuit board 10 to lock the ribbon in place. After this, the upper ribbon rail 15*a* is split and bent wherever circuit cross-overs are desired and redundant circuitry is not necessary.

After the conductive circuit trace pattern has been thus defined by the installation of the ribbon 15, the components 20 are moved into position beneath the base 12 and the conductive component leads 19 are passed through the clearance holes 17 to position the leads adjacent the ribbon 15. The leads 19 are then welded or soldered to one or more of the conductive rails 15*a*, 15*b* of the ribbon 15.

The resultant circuit board 10 is rugged, reliable, capable of withstanding typical welding heats, easily repairable, provides redundant circuitry or crossovers in the same circuit deck, and provides essentially all of the advantages of manual point-to-point wiring with considerably less assembly time.

I claim:

1. An electronic circuit board comprising:

a substantially planar, electrically insulating layer having a plurality of grooves in one surface thereof, said grooves defining at least a portion of a circuit trace pattern, said layer also having at least one clearance hole extending through said layer adjacent to and in communication with said grooves, said layer also having a plurality of recesses in the surface of said layer opposite that in which said grooves are located;

and an electrically conductive ribbon positioned within said grooves, the width of said ribbon being substantially perpendicular to the plane of said layer, said ribbon including a plurality of parallel electrically conductive rails joined together at spaced apart intervals by a plurality of posts bridging between said rails.

2. A device as set forth in claim 1, wherein each post terminates at one end in a locking tab.

3. A device as set forth in claim 2, wherein said locking tab is arrow-shaped.

4. A device as set forth in claim 1, wherein only one of said rails is at least partially within said grooves and the remaining rails are completely outside said layer and capable of deflection relative to the plane of the rail retained within said grooves.

5. A device as set forth in claim 1, and further including a plurality of electrical components having electrically conductive leads passing through said clearance holes in contact with at least one rail of said ribbon.

6. A device as set forth in claim 5, wherein some of said conductive leads contact more than one rail of said ribbon.

7. A device as set forth in claim 6, wherein said conductive leads are welded to said ribbon.

(References on following page)

References Cited

UNITED STATES PATENTS

| | | | |
|---|---|---|---|
| 2,401,468 | 6/1946 | Duffy. | |
| 2,610,248 | 9/1952 | Reid. | |
| 3,185,761 | 5/1965 | McHugh | 174—68.5 |
| 3,193,611 | 7/1965 | Huetten et al. | 174—68.5 |
| 3,249,905 | 5/1966 | Ruehlemann. | |
| 3,349,361 | 10/1967 | Cartelli | 339—18 |

FOREIGN PATENTS

| | | |
|---|---|---|
| 255,512 | 7/1926 | Great Britain. |

DARRELL L. CLAY, Primary Examiner

U.S. Cl. X.R.

29—626, 627; 317—101